(12) United States Patent
Fukuda

(10) Patent No.: US 6,438,044 B2
(45) Date of Patent: Aug. 20, 2002

(54) SEMICONDUCTOR MEMORY DEVICE AND METHOD OF TESTING THE SAME

(75) Inventor: Ryo Fukuda, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/812,681

(22) Filed: Mar. 21, 2001

(30) Foreign Application Priority Data

Mar. 21, 2000 (JP) ........................................ 2000-078420

(51) Int. Cl.$^7$ ............................................... G11C 29/00
(52) U.S. Cl. ........................................ 365/200; 365/201
(58) Field of Search ................................ 365/200, 201, 365/225.7

(56) References Cited

U.S. PATENT DOCUMENTS

| | | | | |
|---|---|---|---|---|
| 5,625,596 A | * | 4/1997 | Uchida | 365/200 |
| 5,668,818 A | | 9/1997 | Bennett et al. | 714/726 |
| 6,041,006 A | * | 3/2000 | Tsuchiya | 365/201 |
| 6,118,710 A | * | 9/2000 | Tsuji | 365/200 |
| 6,310,807 B1 | * | 10/2001 | Ooishi et al. | 365/200 |
| 6,331,956 B1 | * | 12/2001 | Ooishi et al. | 365/200 |

OTHER PUBLICATIONS

Jeffrey Dreibelbis, et al., "TP 5.2: An Asic Library Granular DRAM Macro with Built–In Self Test," Digest of Technical Papers, IEEE International Solid–State Circuits Conference, 1998, pp. 74–75.

* cited by examiner

Primary Examiner—Trong Phan
(74) Attorney, Agent, or Firm—Oblon, Spivak, McClelland, Maier & Neustadt, P.C.

(57) ABSTRACT

Disclosed is a semiconductor memory device comprising a memory circuit including an array of regular memory cells and an array of redundancy memory cells, a memory element including nonvolatile elements for storing unrewritable data that can be stored from outside, a register for holding the data of the memory element before the activation of the memory device, a redundancy determining circuit for comparing the data held in the register and the externally input address and determining the use or non-use of any of the redundancy memory cells and a redundancy data rewriting circuit adapted to receive a redundancy data from a source other than the memory element and input it to the register to use the redundancy data for rewriting.

17 Claims, 6 Drawing Sheets

SEMICONDUCTOR MEMORY DEVICE AND METHOD OF TESTING THE SAME

CROSS-REFERENCE TO RELATED APPLICATIONS

This application is based upon and claims the benefit of priority from the prior Japanese Patent Application No. 2000-078420, filed Mar. 21, 2000, the entire contents of which are incorporated herein by reference.

BACKGROUND OF THE INVENTION

This invention relates to a semiconductor memory device and a method of testing such a device. More particularly, the present invention relates to a fuse data changing circuit for changing the data programmed in a fuse element and also to a built-in self-testing circuit. Such circuits can suitably be used for a dynamic semiconductor memory (DRAM).

In recent years, the technology of mounting a built-in self-testing circuit (BIST circuit) on a semiconductor memory and testing the semiconductor memory device comprising the memory by means of the BIST circuit instead of relying on an external memory tester has been given attention. Such a technology is desired particularly when testing a memory embedded logic that is referred to as system LSI in which a plurality of functional logics including a memory (memory macro) are integrated on a semiconductor chip to form a particular system configured in the single semiconductor chip.

Meanwhile, semiconductor memories manufactured recently with a high packing density typically comprise a redundant circuit so that any faulty memory cells may be replaced by redundant cells to relieve the memory and improve the yield of manufacturing semiconductor memories. The use of BIST circuits for obtaining cell replacement information (redundancy information) has been discussed (JSSCC, vol. 33, No. 11, November, 1998, pp 1731–1740).

However, it is necessary to increase the number of redundant memory cells in order to raise the relief efficiency. Then, the amount of redundancy information rises to consequently increase the pattern area of the registers for storing redundancy information and that of the BIST circuit in a semiconductor memory.

Moreover, as the number of redundant cells is increased in an attempt for improving the relief efficiency, there arises the need of a complicated replacement determining algorithm and a complex pattern sequence necessary for acquiring redundancy information to make the logic circuit for executing them highly complicated. As the result, unfortunately, a faulty rate of the BIST circuit is raised.

As pointed out above, the application of a BIST circuit to a known semiconductor memory entails the disadvantage that, as the number of redundancy memory cells is raised to improve the relief efficiency, the pattern area of the registers for storing redundancy information increases and there arises the need of a complicated replacement determining algorithm and a complex pattern sequence to make the logic circuit for executing them highly complicated and consequently raise the faulty rate of the BIST.

BRIEF SUMMARY OF THE INVENTION

In view of the above identified circumstances it is therefore an object of the present invention to provide a semiconductor memory device comprising a BIST circuit for acquiring redundancy information that can be realized with a minimal increase of the pattern area and uses a simple algorithm to consequently reduce the faulty rate of the BIST circuit as well as a method of testing such a semiconductor memory device.

Another object of the present invention is to provide a semiconductor memory device in which data can be transferred to a following-stage circuit whenever necessary regardless of the data stored electrically in a memory element that is not data-rewritable so that the input to the following-stage circuit can be easily handled.

According to a first aspect of the present invention, there is provided a semiconductor memory device comprising a memory circuit having an array of regular memory cells and an array of redundancy memory cells; a storage element for storing redundancy data formed by non-volatile elements adapted to store externally programmable data but not adapted to electrically rewrite the stored data; a register for holding the redundancy data of the storage element when the semiconductor memory device is activated; a redundancy determining circuit for comparing the data held in the register and an externally input address to determine the use or non-use of any of the redundancy memory cells; and a redundancy data rewriting circuit for rewriting the redundancy data held in the register to a different redundancy data.

In the semiconductor memory device according to the first aspect of the present invention, the redundancy data rewriting circuit may be controlled by a signal from a test circuit mounted on a semiconductor chip of the semiconductor memory device or a signal of a test circuit provided outside the semiconductor chip. In the semiconductor memory device, the test circuit may be a built-in type test circuit for self-generating a test pattern. In the semiconductor memory device, the memory circuit may have an X, Y two-dimensional address space and two-dimensional redundancy memory cells, and the built-in test circuit may perform the sequence including the steps of changing the X addresses on the basis of a unit of redundancy, while fixing the Y address, and testing the X addresses of the unit of redundancy, while fixing the Y address to determine whether faulty memory cells are detected or not; using the Y redundancy memory cells when the faulty memory cells are not relieved by using the X redundancy cells alone, while using the X redundancy memory cells when the faulty memory cells are relieved by using the X redundancy cells alone; testing again the X addresses; continuing the test and the relief operation until no faulty memory cells are detected; performing the test and the relief operation to next and succeeding X addresses of the unit of redundancy after the elimination of faulty memory cells; shifting the Y address and performing a similar test in the X direction; and outputting a pass signal at the time of completion of the test of the last address of the unit of redundancy, while outputting a fail signal to end the test operation in the case of consuming all the redundancy cells before outputting a pass signal. In the semiconductor memory device, the built-in type test circuit may comprise a data generation circuit for generating a pattern of data to be written to the memory circuit; an address generation circuit for generating an address pattern to specify an address of the memory circuit; an expected value generation circuit for generating an expected value data relative to an output data of the memory circuit; a data comparison circuit for comparing the output data and the expected value data; and a redundancy allocation circuit for determining an allocation of the redundancy memory cells in response to an output of the data generation circuit and an output of the address generation circuit, the redundancy data rewriting circuit being controlled by an output of the redundancy allocation circuit. In the semiconductor memory device, the built-in test circuit may perform the sequence in which changing the addresses on the basis of a unit of redundancy, testing the addresses of the unit of redundancy to determine whether faulty memory cells are detected or not, and relieving the faulty memory cells by using the redundancy memory cells; inputting redundant information to the register by means of the redundancy data rewriting circuit; testing again the addresses; continuing the test and the relief operation until no faulty memory cells are detected; performing the test and the relief operation to next and succeeding addresses of the unit of redundancy after the elimination of faulty memory cells; outputting a pass signal at the time of completion of the test to the last addresses of the unit of redundancy, while outputting a fail signal to end the test operation in the case of consuming all the redundancy cells before outputting a pass signal.

In the semiconductor memory device according to the first aspect of the present invention, the semiconductor memory device may further comprise redundancy data read circuit for reading the data held in the register to the outside. In the semiconductor memory device, the redundancy data rewriting circuit may be controlled by a signal from a test circuit mounted on a semiconductor chip of the semiconductor memory device or a signal of a test circuit provided outside the semiconductor chip. In -the semiconductor memory device, the test circuit may be a built-in type test circuit for self-generating a test pattern. In the semiconductor memory device, the built-in type test circuit may comprise a data generation circuit for generating a pattern of data to be written to the memory circuit; an address generation circuit for generating an address pattern to specify an address of the memory circuit; an expected value generation circuit for generating an expected value data relative to an output data of the memory circuit; a data comparison circuit for comparing the output data and the expected value data; and a redundancy allocation circuit for determining an allocation of the redundancy memory cells in response to an output of the data generation circuit and an output of the address generation circuit, the redundancy data rewriting circuit being controlled by an output of the redundancy allocation circuit. In the semiconductor memory device, the built-in test circuit may perform the sequence in which changing the addresses on the basis of a unit of redundancy, testing the addresses of the unit of redundancy to determine whether faulty memory cells are detected or not, and relieving the faulty memory cells by using the redundancy memory cells; inputting redundant information to the register by means of the redundancy data rewriting circuit; testing again the addresses; continuing the test and the relief operation until no faulty memory cells are detected; performing the test and the relief operation to next and succeeding addresses of the unit of redundancy after the elimination of faulty memory cells; outputting a pass signal at the time of completion of the test to the last addresses of the unit of redundancy, while outputting a fail signal to end the test operation in the case of consuming all the redundancy cells before outputting a pass signal. In the semiconductor memory device, the memory circuit may have an X, Y two-dimensional address space and two-dimensional redundancy memory cells, and the built-in test circuit may perform the sequence including the steps of changing the X addresses on the basis of a unit of redundancy, while fixing the Y address, and testing the X addresses of the unit of redundancy, while fixing the Y address to determine whether faulty memory cells are detected or not; using the Y redundancy memory cells when the faulty memory cells are not relieved by using the X redundancy cells alone, while using the X redundancy memory cells when the faulty memory cells are relieved by using the X redundancy cells alone; testing again the X addresses; continuing the test and the relief operation until no faulty memory cells are detected; performing the test and the relief operation to next and succeeding X addresses of the unit of redundancy after the elimination of faulty memory cells; shifting the Y address and performing a similar test in the X direction; and outputting a pass signal at the time of completion of the test of the last address of the unit of redundancy, while outputting a fail signal to end the test operation in the case of consuming all the redundancy cells before outputting a pass signal.

According to a second aspect of the present invention, there is provided a semiconductor memory device comprising a storage element adapted to program data and not adapted to electrically rewrite the stored data; a transfer circuit for transferring the data stored in the storage element to a following-stage circuit; a changing circuit in the transfer circuit and adapted to selectively change the data to be transferred.

In the semiconductor memory device according to the second aspect of the present invention, the transfer circuit may further comprise a data holding circuit for holding the data stored in the storage element; and the changing circuit may be adapted to destroy the data held in the data holding circuit and change to a different data.

In the semiconductor memory device according to the second aspect of the present invention, the changing circuit may be adapted to inactivate the transfer of the data stored in the storage element and change to a different data.

According to a third aspect of the present invention, there is provided a method of testing a semiconductor memory device comprising an array of regular memory cells and an array of redundancy memory cells to be used for relief by means of a built-in type test circuit, the method comprising a step of performing a sequence of changing the addresses on the basis of a unit of redundancy, testing the addresses of the unit of redundancy to determine whether faulty memory cells are detected or not, and relieving the faulty memory cells by using the redundancy memory cells; inputting redundant information to the register; testing again the addresses; continuing the test and the relief operation until no faulty memory cells are detected; and performing the test and the relief operation to next and succeeding addresses of the unit of redundancy after the elimination of faulty memory cells; and a step of outputting a pass signal at the time of completion of the test to the last addresses of the unit of redundancy, while outputting a fail signal to end the test operation in the case of consuming all the redundancy cells before outputting a pass signal.

According to a fourth aspect of the present invention, there is provided a method of testing a semiconductor memory device comprising an X, Y two-dimensional address space and two-dimensional redundancy memory cells by means of a built-in type test circuit, the method performs the sequence including the steps of changing the X addresses on the basis of a unit of redundancy, while fixing the Y address, and testing the X addresses of the unit of redundancy, while fixing the Y address to determine whether faulty memory cells are detected or not; using the Y redundancy memory cells when the faulty memory cells are not relieved by using the X redundancy cells alone, while using the X redundancy memory cells when the faulty memory cells are relieved by using the X redundancy cells alone; testing again the X addresses; continuing the test and the relief operation until no faulty memory cells are detected;

performing the test and the relief operation to next and succeeding X addresses of the unit of redundancy after the elimination of faulty memory cells; shifting the Y address and performing a similar test in the X direction; and outputting a pass signal at the time of completion of the test of the last address of the unit of redundancy, while outputting a fail signal to end the test operation in the case of consuming all the redundancy cells before outputting a pass signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, the present invention will be described in greater detail by referring to the accompanying drawing that illustrates preferred embodiments of the present invention.

Figure 1:
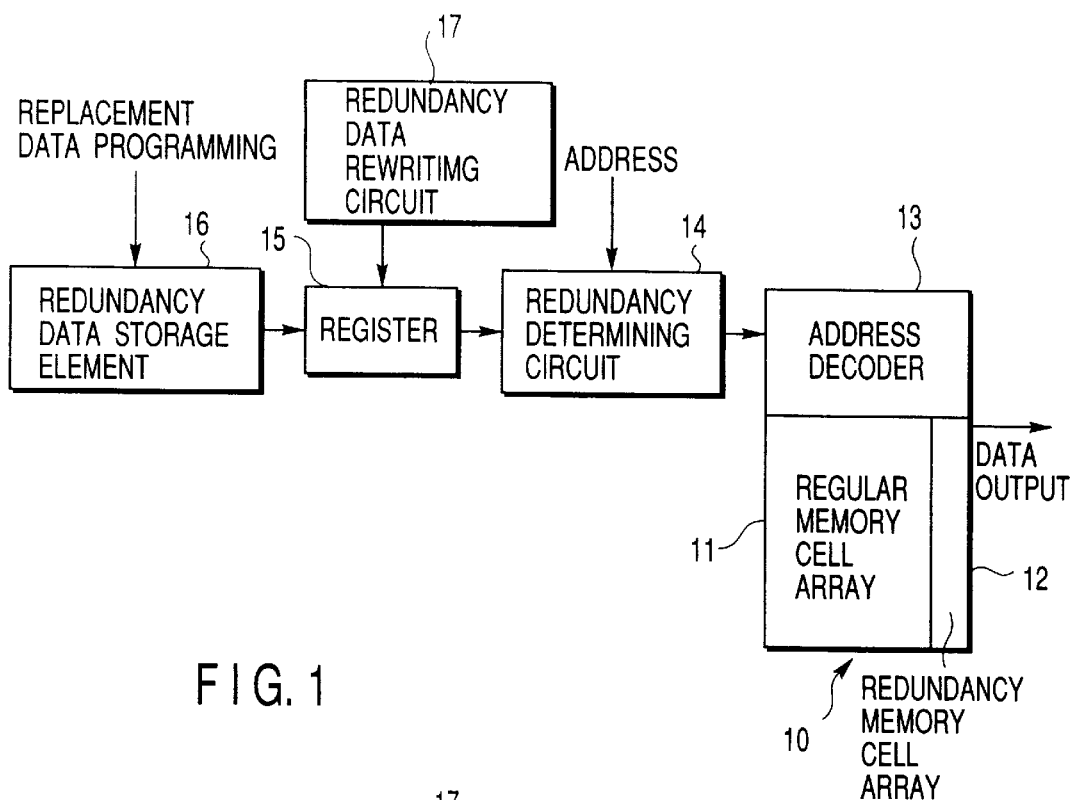
FIG. 1 is a schematic block diagram of part of a semiconductor memory device, or a DRAM, according to a first embodiment of the present invention.

FIG. 1 is a schematic block diagram of part of a semiconductor memory device (DRAM) according to a first embodiment of the present invention.

Referring to FIG. 1, memory circuit 10 has a typical configuration including a regular memory cell array (i.e. a so-called memory cell array) 11 including regular memory cells (i.e. so-called memory cells) arranged in the form of a matrix, a redundancy memory cell array (i.e. a so-called redundancy cell array) 12 to be used as replacement for the regular memory cell array 11 on the basis of a unit of row or column when some of the cells of the regular memory cell array 11 are faulty in order to avoid a reduction of yield in the process of manufacturing semiconductor memories, and an address decoder 13 for selecting a cell of the regular memory cell array 11 or the redundancy memory cell array 12 by decoding the address data.

Redundancy data storage element 16 stores redundancy data (redundancy relief information, cell replacement information). Redundancy data are programmed by a replacement data programming means. In the case of a DRAM of the type under consideration, a non-volatile element that is typically a fuse element for which data to be stored can be externally programmed but which cannot be electrically data-rewritten is used for the redundancy data storage element 16. Then, the data of the fuse element is programmed by way of a laser beam process (fusing of the fuse element by irradiation of a laser beam).

The register 15 is used to store redundancy data. More specifically, the register 15 stores the data of the redundancy data memory element 16 when the DRAM is activated or powered-on. The redundancy data storage element 16 and the register 15 are indispensable components as redundancy system in the DRAM.

A redundancy data rewriting circuit 17 is provided in order to rewrite the redundancy data of the redundancy data storage element 16 stored in the register 15 and operates as a redundancy data input means independent from the redundancy data storage element 16.

A redundancy determining circuit 14 compares the address input thereto from outside with the redundancy address data stored in the register 15 and, if the addresses coincide with each other, transmits the redundancy address to the address decoder 13 instead of the externally input address. However, the redundancy determining circuit 14 transmits the externally input address to the address decoder 13 when the addresses do not coincide with each other. That is, the redundancy determining circuit 14 determines if a redundancy memory cell is to be used in place of the cell specified by the externally input address or not.

The address decoder 13 activates a line of the regular memory cell array 11 or a line of the redundancy memory cell array 12 selected by the address data from the redundancy determining circuit 14. Then, as a result, data stored in the selected cell of the memory cell array 11 or the redundancy memory cell array 12 is output from the memory circuit 10.

Figure 2A:
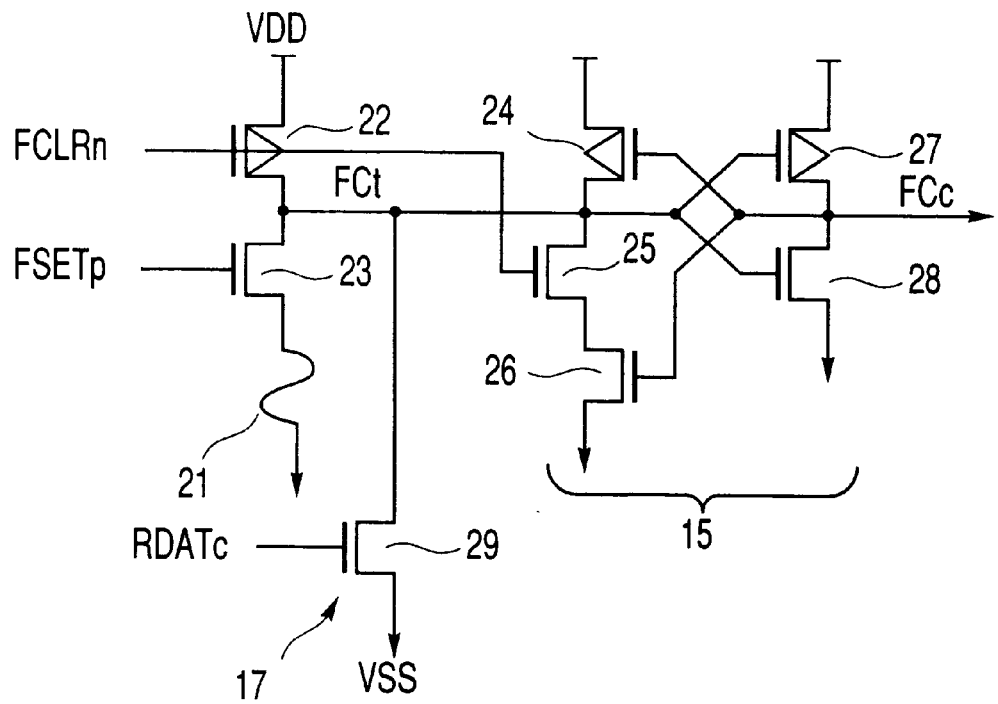
FIG. 2A is a circuit diagram including the redundancy data storage element 16, the register 15 and the redundancy data rewriting circuit 17 in the semiconductor memory device shown in FIG. 1.

FIG. 2A is a circuit diagram including the redundancy data storage element 16, the register 15 and the redundancy data rewriting circuit 17 in the DRAM shown in FIG. 1.

Referring to FIG. 2A, reference symbol 21 denotes the fuse element that is the redundancy data storage element 16 in FIG. 1. It is made to store data "1" or "0" depending on if the fuse element 21 is fused, i.e. cut, by, for example, irradiation of a laser beam or not.

In FIG. 2A, reference symbols 22, 24, and 27 denote PMOSFETs (PMOS transistors) and reference symbols 23, 25, 26, 28 and 29 denote NMOSFETs (NMOS transistors). Of these transistors, the source of the PMOS transistor 22 is connected to the power supply (VDD) node while the drain of the PMOS transistor 22 and the drain of the NMOS transistor 23 are commonly connected to node FCt. The fuse element 21 is connected between the source of the NMOS transistor 23 and the ground potential (VSS) node. Precharge control signal FCLRn is input to the gate of the PMOS transistor 22 and fuse set signal FSETp is input to the gate of the NMOS transistor 23.

On the other hand, the register 15 is formed by the PMOS transistors 24, 27 and the NMOS transistors 25, 26, 28. More specifically, the source of the PMOS transistor 24 is connected to the VDD node and the source of the NMOS transistor 26 is connected to the ground node, while the node between the drain and the source of the NMOS transistor 25 is connected between the drain of the PMOS transistor 24 and the drain of the NMOS transistor 26. The signal FCLRn is input to the gate of the NMOS transistor 25. The source of the PMOS transistor 27 is connected to the VDD node and the source of the NMOS transistor 28 is connected to the ground node.

The gates of the PMOS transistor 27 and the NMOS transistor 28 and the drains of the PMOS transistor 24 and the NMOS transistor 25 are commonly connected to the node FCt.

Similarly, the gates of the PMOS transistor 24 and the NMOS transistor 26 and the drains of the PMOS transistor 27 and the NMOS transistor 28 are commonly connected to the output node FCc of the register 15.

In this embodiment, a redundancy data rewriting circuit 17 is provided for a single redundancy data storage element 16. An NMOS transistor 29 between the drain and the source of which the node FCt and the VSS node are connected is provided for the redundancy data rewriting circuit 17. Rewriting control signal RDATc is input to the gate of the NMOS transistor 29.

Figure 2B:
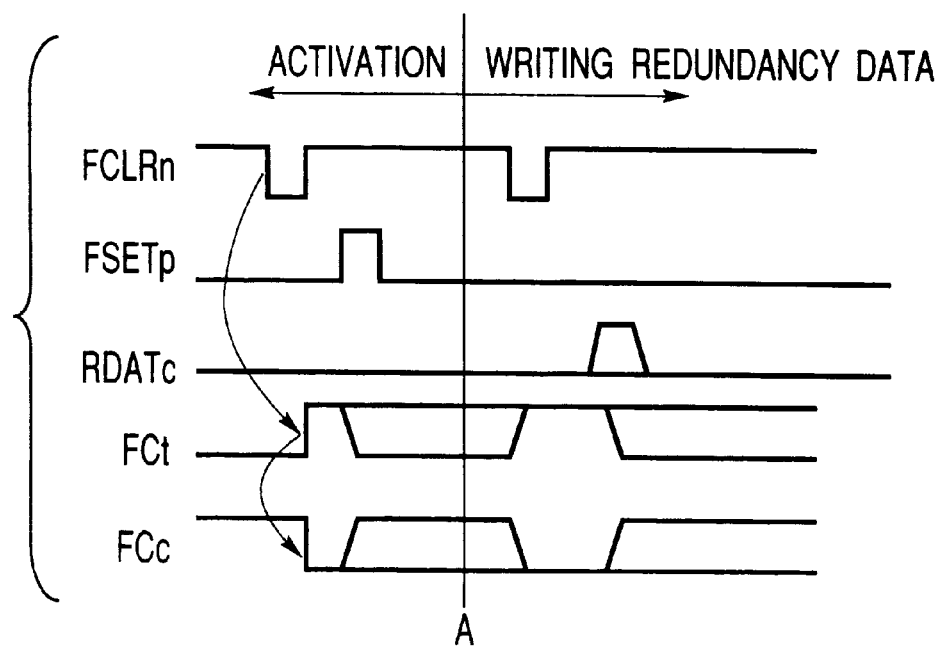
FIG. 2B shows the signal waveforms of the operation of the circuit shown in FIG. 2A.

FIG. 2B is a graph showing the timing waveforms of the operation of the circuit of the DRAM of FIG. 2A. In FIG. 2B, the ordinate represents time. The waveforms before time point A show the operation of storing data to the register 15 that takes place when the DRAM is activated i.e. powered-on, while the waveforms after the time point A show the operation of rewriting data to the register 15.

Firstly, the operation of storing data in the register 15 that takes place when the DRAM is activated will be described. As the device is activated, precharge control signal FCLRn comes to "L" from "H" to turn the PMOS transistor 22 on and precharge the node FCt to "H". As a result, the NMOS trigger signal 28 is turned on to precharge the register output node FCc to "L". From then on, the potential of the node FCc and that of the node Fct do not change if the signal FCLRn returns to "H".

Thereafter, the NMOS transistor is turned on when the fuse set signal FSETP comes to "H" from "L". At this time, both the PMOS transistor and the NMOS transistor 23 are turned on. The electric potential of the node FCt depends on the balance of the drive capacity of the PMOS transistor 24 and that of the NMOS transistor 23. Note that the NMOS transistor 23 and the PMOS transistor 24 are designed so that the drive capacity of the NMOS transistor 23 exceeds that of the PMOS transistor 24.

With this arrangement, when the fuse element 21 is cut, the node FCt remains at "H" and the register output node FCc remains at "L". When, on the other hand, the fuse element 21 is not cut, the node Fct becomes "L" to consequently turns the PMOS transistor 27 on and brings the register node FCc to "H". If the state where the fuse element 21 is cut is handled as "H" in the following-stage circuits, then an inverted logic of the logic of the node FCc is used as a signal in the following-stage circuits.

From then on, the electric potential of the node FCt and that of the node FCc do not change if the signal FSETp comes to "L" from "H". Once this arrangement is set, the logic level of the node FCt and that of the FCc cannot be changed unless the power supply is cut or the next redundancy data rewriting operation takes place. Note that the rewriting control signal RDATC is held to "L" during the operation of storing data to the register 15 that takes place when the DRAM is activated.

When, on the other hand, a redundancy data is written to the register 15 by the redundancy data rewriting circuit 17 to rewrite the redundancy data already stored in the register 15, the precharge control signal FCLRn is brought to "L" from "H" to precharge the node FCt and the node FCc to "H" and "L" respectively. At this time, the information programmed in the fuse element 21 is lost. From then on, the nodes FCt and FCc do not change if the signal FCLRn is brought back to "H".

Thereafter, when writing "H" as a redundancy data, which means to produce a state similar to the state where the fuse element 21 is cut, the rewriting control signal RDATc is held to "L". Then, the nodes FCt and FCc remain at "H" and "L" respectively.

When, on the other hand, writing "L" as a redundancy data, which means to produce a state similar to the state where the fuse element 21 is not cut, the rewriting control signal RDATc is brought to "H". Then, the NMOS transistor 29 is turned on. At this time, both the PMOS transistor 24 and the NMOS transistor 29 become on. The electric potential of the node FCt depends on the balance of the drive capacity of the PMOS transistor 24 and that of the NMOS transistor 29. Note that the NMOS transistor 29 and the PMOS transistor 23 are designed so that the drive capacity of the NMOS transistor 29 exceeds that of the PMOS transistor 23. As a result, the node FCt becomes "L" while the node FCc becomes "H" at this time.

From then on, the electric potential of the node FCt and that of the node FCc do not change if the signal RDATC comes to "L" from "H". Once this arrangement is set, the logic level of the node FCt and that of the FCc cannot be changed unless the power supply is cut or the above sequence arrangement is reset.

As will be clear from the above description, with the first embodiment of DRAM, the redundancy data that is stored in the register 15 from the fuse element 21 at the time when the DRAM is activated can be rewritten by the redundancy data rewriting circuit 17. The redundancy data rewriting circuit 17 is formed by one NMOS transistor 29 provided for one fuse element 21 and, therefore, the pattern area of the entire circuit can be considerably reduced if compared with the case where a number of registers sufficient for the redundancy information are arranged.

Conventionally, when manufacturing DRAMS, redundancy memory cells and regular memory cells are tested separately for the purpose of obtaining redundancy data during the preliminary die sorting operation conducted in the wafer processing step. Then, the detected faulty cells are replaced by redundancy memory cells by programming the fuse element 21 on the basis of the obtained redundancy data.

Then, the final die sorting operation is performed to sort out normal chip and fault chip.

With the first embodiment of DRAM, on the other hand, since it is possible to rewrite the redundancy data stored in the register 15 during the test, the redundancy memory cells can be tested in an operating condition so that the test coverage is enhanced.

The system may alternatively be so arranged that the operation of rewriting the redundancy data by means of the redundancy data rewriting circuit 17 during the test is controlled by a signal from a test circuit mounted on the DRAM semiconductor chip or an external circuit. If a test circuit is mounted on the semiconductor chip, it may be a built-in type test circuit capable of generating a test pattern, for example, a built-in type test circuit adapted to automatically test the memory circuit only by means of an external clock.

As described above in terms of the first embodiment, a semiconductor memory device according to the present invention is characterized by comprising a data changing circuit provided in a data transfer circuit system for transferring data to a following-stage circuit. The data changing circuit can change data programmed in the memory element in which the data to be stored can be programmed and the programmed data cannot electrically be rewritten. In the case of the above described first embodiment, the memory element is a fuse element 21, and a data holding means (the register 15) for holding the data stored in the fuse element 21 and a data rewriting circuit 17 adapted to destroying the data held in the register 15 and replacing the data by a different data are provided in the transfer circuit system.

Therefore, if necessary, for example, when testing the redundancy of the circuit, it is possible to transfer a data different from the data (e.g., redundancy data) stored in the memory element where the stored data cannot electrically be rewritten to a following-stage circuit so that the input to the following-stage circuit can be easily attained.

The data changing circuit provided in the transfer circuit system capable of transferring the data of the memory element may be so adapted to inactivate the transfer of the data of the fuse element 21 (without destroying the data) and changing to a different data. In such a case, a similar advantage will be obtained.

Figure 3A:
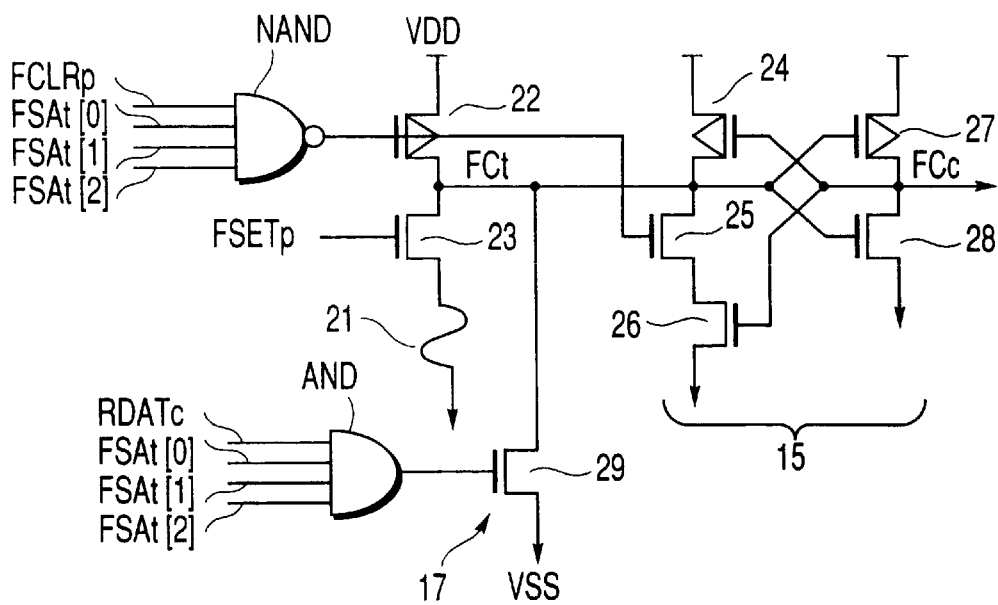
FIG. 3A is a circuit diagram including the redundancy data storage element 16, the register 15 and the redundancy data rewriting circuit 17 in the semiconductor memory device shown in FIG. 1, when each fuse set is selected by an address signal.

FIG. 3A illustrates an arrangement where a plurality of circuits (fuse sets), each having the configuration of FIG. 2A, are provided and a fuse set is selected according to an address signal so that the redundancy data of the selected fuse set may be rewritten. Note that FIG. 3A shows only one of the fuse sets.

The circuit of FIG. 3A differs from that of FIG. 2A in that (1) the circuit further comprises a NAND circuit for receiving 3-bit signals FSAt [0], FSAt [1] and FSAt [2] (to be referred to collectively as FSAt [0–2] for the purpose of convenience) representing input signal FCLRp that is an inverted signal of the signal FCLRn and the address of the fuse set and the output signal of the NAND circuit is input to the gates of the transistors 22, 25 in place of signal FCLRn and (2) the circuit also further comprises an AND circuit for receiving signal RDAT and signals FSAt [0–2] and the output signal of the AND circuit is input to the gate of the transistor 29 in place of signal RDAT. Otherwise, the circuit of FIG. 3A is identical with that of FIG. 2A and hence the other components are denoted respectively by the same reference symbols.

Figure 3B:
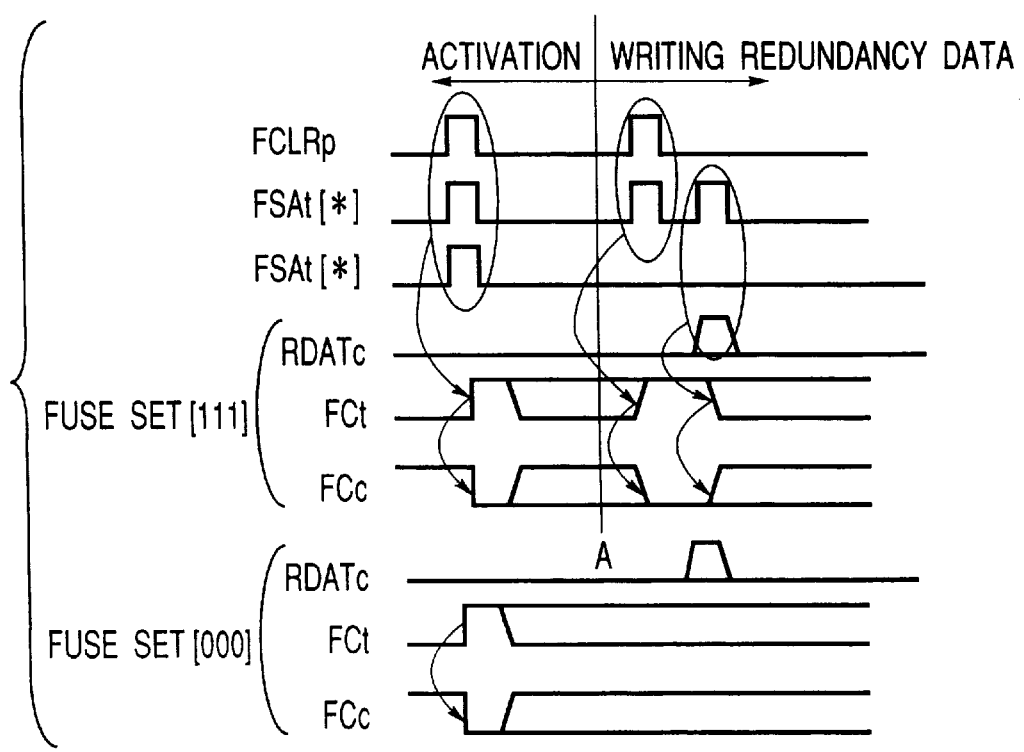
FIG. 3B shows the signal waveforms of the operation of the circuit shown in FIG. 3A.

FIG. 3B illustrates the waveform of the operation of storing data in the register 15 when the circuit of FIG. 3A is activated (before time point A) and that of the operation of writing redundancy data to the register 15 (after time point A). Note that the address signals FSAt [0–2] of the first fuse set [111] and the address signals FSAt [0–2] of the second fuse set [000] are expressed respectively by FSAt [*] and FSAc [*].

Firstly, when the circuit is activated, the precharge control signal FCLRp becomes "H" from "L". At this time of activation of the circuit, an "H" signal is input for each of the bits of signal FSAt [*] and signal FSAc [*]. Therefore, in each of the fuse sets [111] and [000], the output signal of the NAND circuit is brought to "L" to turn on the PMOS transistor 22 and precharge the node FCt to "H". From then on, the electric potentials of the nodes FCt and FCc do not change if the signal FCLRp returns to "L".

Subsequently, the NMOS transistor 23 is turned on when the fuse set signal FSETP is brought to "H" from "L". At this time, both the PMOS transistor 24 and the NMOS transistor 23 are turned on. The electric potential of the node FCt depends on the balance of the drive capacity of the PMOS transistor 24 and that of the NMOS transistor 23. Note that the NMOS transistor 23 and the PMOS transistor 24 are designed such that the drive capacity of the NMOS transistor 23 exceeds that of the PMOS transistor 24.

With this arrangement, when the fuse element 21 is cut, the node FCt remains at "H" and the register output node FCc remains at "L". When, on the other hand, the fuse element 21 is not cut, the node Fct becomes "L" to consequently turns on the PMOS transistor 27 and brings the register node FCcc to "H". If the state where the fuse element 21 is cut is handled as "H" in the following-stage circuits, then an inverted logic of the logic of the node FCc is used as a signal in the following-stage circuits.

From then on, the electric potential of the node FCt and that of the node FCc do not change if the signal FSETp comes to "L" from "H". Once this arrangement is set, the logic level of the node FCt and that of the FCc cannot be changed unless the power supply is cut or the next redundancy data rewriting operation takes place. Note that the rewriting control signal RDATc is held to "L" and the output signal of the AND circuit is also held to "L" during the operation of storing data to the register 15 that takes place when the DRAM is activated.

When, on the other hand, redundancy data is written to the register 15, the precharge control signal FCLRp is brought to "L" from "H". At this time, the second fuse set [000] is not selected by the signal FSAc [*] and hence keeps on holding the data before the redundancy data rewriting operation.

Contrary to this, the first fuse set [111] is selected by the signal FSAt [*] so that a redundancy data writing operation takes place. More specifically, in the first fuse set [111], the output signal of the NAND circuit is brought to "L" to precharge the node FCt and the node FCc to "H" and "L" respectively. At this time, the information programmed in the fuse element 21 is lost. From then on, the nodes FCt and FCc do not change if the signal FCLRn is brought back to "L".

Thereafter, when writing "H" as redundancy data to produce a state similar to the state where the fuse element 21 is cut, the rewriting control signal RDATC is held to "L". Then, the output signal of the AND circuit is held to "L" and nodes FCt and FCc remain at "H" and "L" respectively.

When, on the other hand, writing "L" as redundancy data to produce a state similar to the state where the fuse element 21 is not cut, the rewriting control signal is brought to "H". Then, the output signal of the AND circuit is brought to "H" and the NMOS transistor 29 is turned on. At this time, both the PMOS transistor 24 and the NMOS transistor 29 become on. The electric potential of the node FCt depends on the balance of the drive capacity of the PMOS transistor 24 and that of the NMOS transistor 29. Note that the NMOS transistor 29 and the PMOS transistor 24 are designed such that the drive capacity of the NMOS transistor 29 exceeds that of the PMOS transistor 24. As a result, the node FCt becomes "L" while the node FCc becomes "H" at this time.

From then on, the electric potential of the node FCt and that of the node FCc do not change if the signal RDATc comes to "L" from "H". Once this arrangement is set, the logic level of the node FCt and that of the FCc cannot be changed unless the power supply is cut or the above sequence arrangement is reset.

Figure 4:
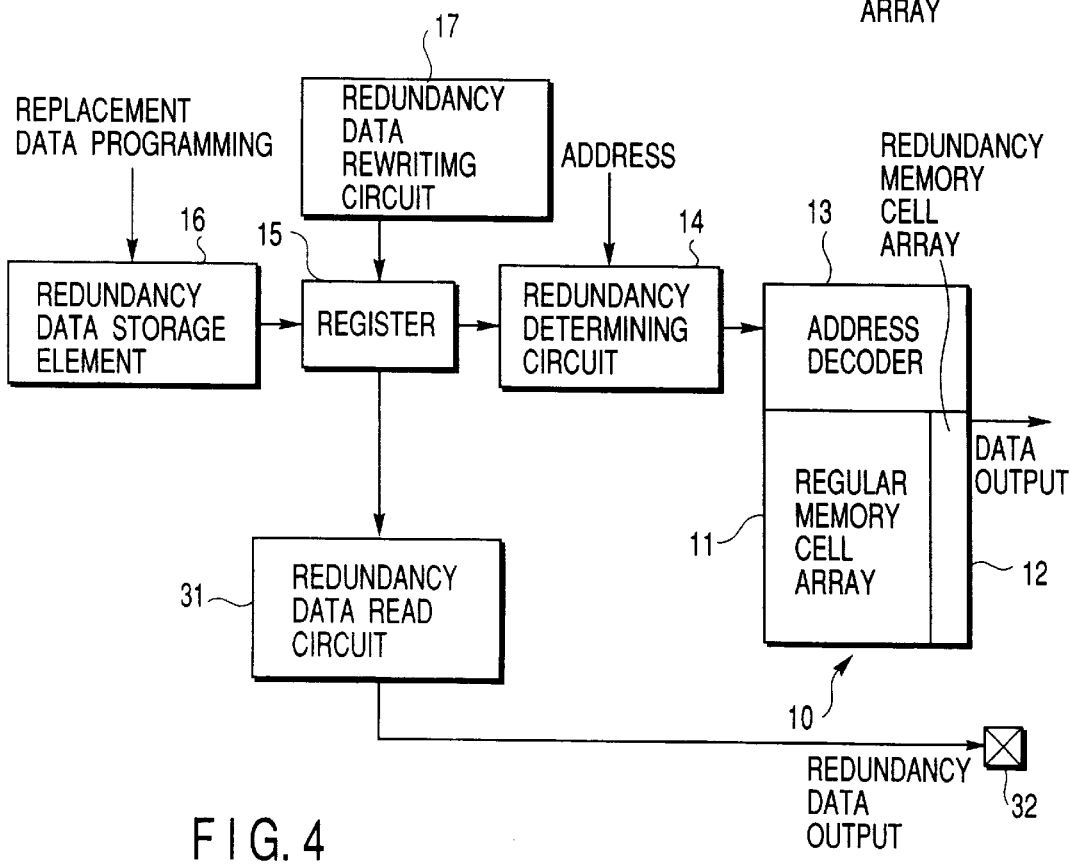
FIG. 4 is a schematic block diagram of a modification of the DRAM shown in FIG. 1.

FIG. 4 is a schematic block diagram of a DRAM obtained by modifying that of FIG. 1.

The components denoted by reference symbols 11 through 17 in FIG. 3 are similar to those in FIG. 1. On the other hand, this modified embodiment differs from the DRAM of FIG. 1 in that the modified circuit further comprises a redundancy data read circuit 31. Therefore, only the difference will be briefly described here. The redundancy data read circuit 31 is adapted to read the data stored in the register 15 and output the data to an external terminal (e.g., pad) 32 as redundancy data. There are various techniques that can be used for reading the redundancy data from the register 15 and sending the redundancy data to the outside. For example, the redundancy data may be output via a data line.

The state of redundancy can be confirmed at the time of a test by arranging a redundancy data read circuit 31 and reading the redundancy data from the register 15 as in this modified embodiment.

Figure 5:
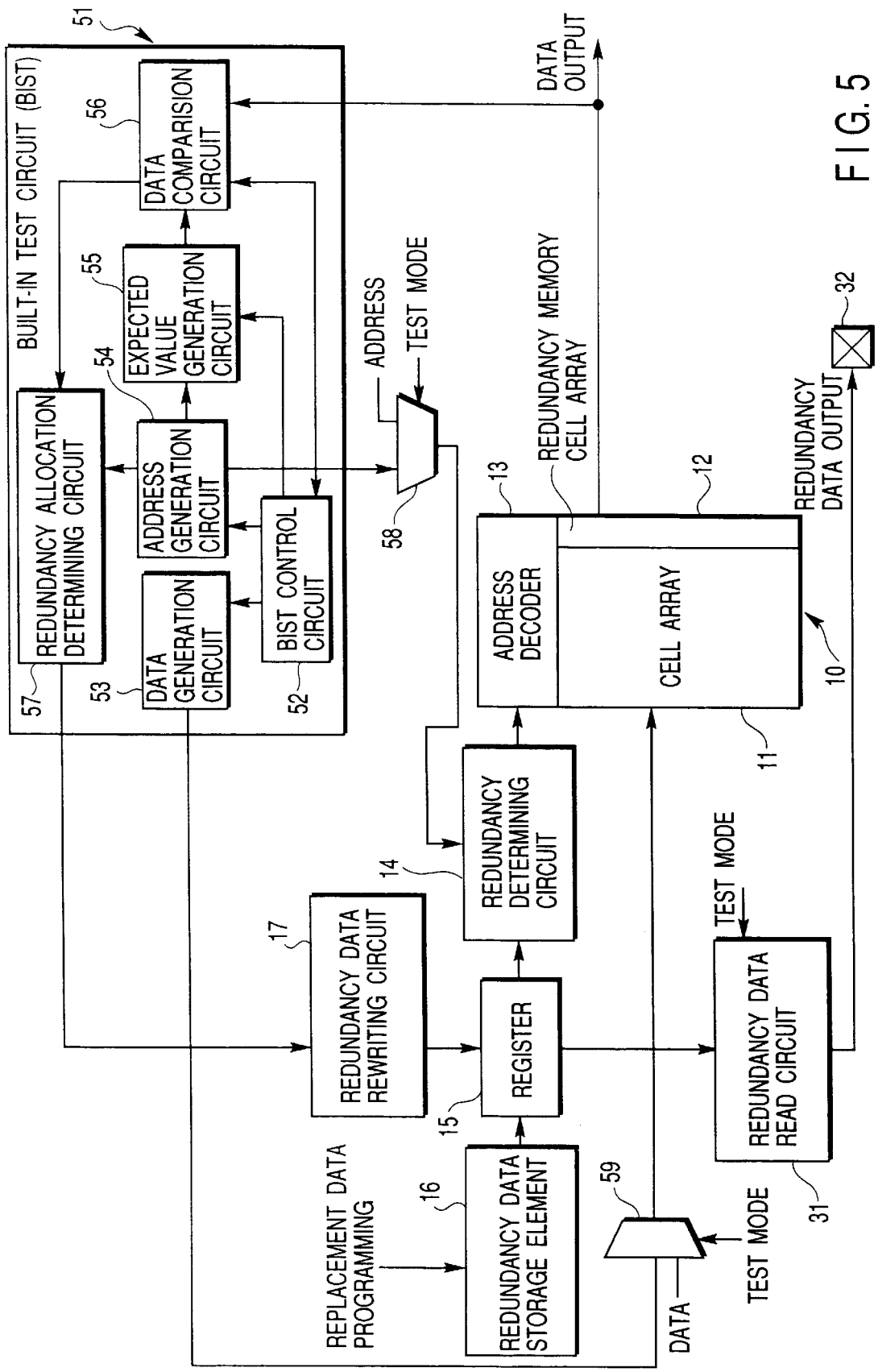
FIG. 5 is a schematic block diagram of part of a semiconductor memory device, or a DRAM, according to a second embodiment of the present invention.

FIG. 5 is a schematic block diagram of part of a semiconductor memory device, or a DRAM, of a second embodiment according to the present invention. In FIG. 5, the components denoted by reference symbols 11 through 17, 31 and 32 are the same as those of FIG. 4. Therefore, only the difference will be briefly described here. In FIG. 5, reference symbol 51 denotes a BIST circuit and reference symbols 58 and 59 respectively denote an address multiplexer and a data multiplexer. Both the address multiplexer 58 and the data multiplexer 59 are controlled by a test mode signal.

The address multiplexer 58 selects the external input address and supplies the external input address to the redundancy determining circuit 14 in an regular mode where the test mode signal is inactive, whereas the address multiplexer 58 selects the address from the BIST circuit 51 and supplies the selected address to the redundancy determining circuit 14 in a test mode where the test mode signal is activated.

On the other hand, the data multiplexer 59 selects the internal data and supplies the internal data to the memory circuit 10 in an regular mode where the test mode signal is inactive, whereas the data multiplexer 59 selects the test data from the BIST circuit 51 and supplies the test data to the memory circuit 10 in a test mode where the test mode signal is activated.

The BIST circuit 51 comprises a BIST control circuit 52 that is a sequencer, a data generation circuit 53 for generating an input data (data pattern), an address generation circuit 54 for generating an input address to the memory circuit 10, an expected data generation circuit 55 for generating an expected data from the address output of the address generation circuit 54, a data comparison circuit 56 for comparing the expected data output of the expected data generation circuit 55 and the data output of the memory circuit 10 and determining the outcome (pass or fail) of the data output of the memory circuit 10 and a redundancy allocation determining circuit 57 that operates for redundancy allocation when the outcome of the comparison of the data comparison circuit 56 refers to a fail.

The redundancy allocation determining circuit 57 can control the register 15 for storing redundancy information by way of the redundancy data rewriting circuit 17.

Now, the operation of the BIST circuit 51 will be described. Firstly, the address is changed on the basis of a unit of redundancy i.e. on the basis of a unit of redundancy to replace the faulty cell by a redundancy memory cell on the basis of a unit of redundancy. Then, the replacement information is input to the register 15 and the replacement redundancy memory cell is again designated by the address and subjected to a test. This operation of replacing a faulty cell by a redundancy memory cell is repeated until there is no faulty cell and the replacement redundancy memory cell is subjected to a test in each replacing operation. When it is found that there is no longer any faulty cell, the address is changed to the next address to test each of the replacement redundancy memory cells to be conducted on the basis of a unit of redundancy as described above. When the last relief operation conducted on the basis of a unit of redundancy is completed, pass signal Pass is output. If the relief cells are run out in the replacement process, fail signal Fail is output so that a sequence operation for terminating the test is performed. With this arrangement, it is no longer necessary to test individual redundancy memory cells and it is possible to acquire relief information and carry out a replacement operation by means of a BIST circuit having a simple logic.

Figure 6:
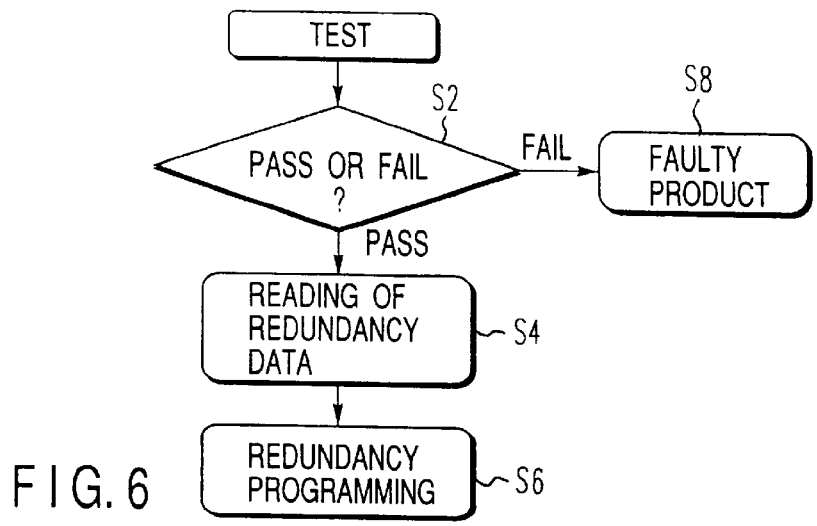
FIG. 6 is a flow chart of a testing method of the DRAM shown in FIG. 5.

Now, the method of testing the DRAM of FIG. 5 will be described by referring to FIG. 6.

Since the BIST circuit 51 performs a test (Steps S2, S4, S6 and S8) that uses the redundancy memory cells, while rewriting the redundancy information, the redundancy information when the test is over is stored in the register 15. After the end of the test performed by means of the BIST circuit 51, a program mode (Step S4) is set in which the information (redundancy data) of the register 15 is read to the outside and the redundancy data storage element 16 is programmed by means of the replacement data programming means in accordance with the information read from the register 15 (Step S6). The circuit configuration can be simplified to minimize the pattern area when it is so arranged that the data in the register 15 is serially read by a scanning method in this program mode.

The BIST circuit 51 of the above described second embodiment comprises a BIST control circuit 52, a data generation circuit 53, an address generation circuit 54, an expected data generation circuit 55, a data comparison circuit 56 and a redundancy allocation determining circuit 57, and it is possible to automatically test the memory circuit only by means of an external clock. Since the register 15 is controlled by directly controlling the redundancy data rewriting circuit 17, using the output of the redundancy allocation determining circuit 57, it is not necessary to provide the BIST circuit 51 with a register for holding redundancy data since the register 15 existing in the memory circuit section can be used. Therefore, the pattern area of the BIST circuit 51 on the semiconductor chip can be greatly reduced if compared with conventional semiconductor devices.

Furthermore, the redundancy can be tested nearly in an actual-operation condition to increase the test coverage. Still further, since it is not necessary to test the redundancy memory cells separately and to store the addresses of the faulty cells, the overall test including the test of the redundancy memory cells can be simplified, which also simplifies the circuit configuration of the BIST circuit 51.

Figure 7:
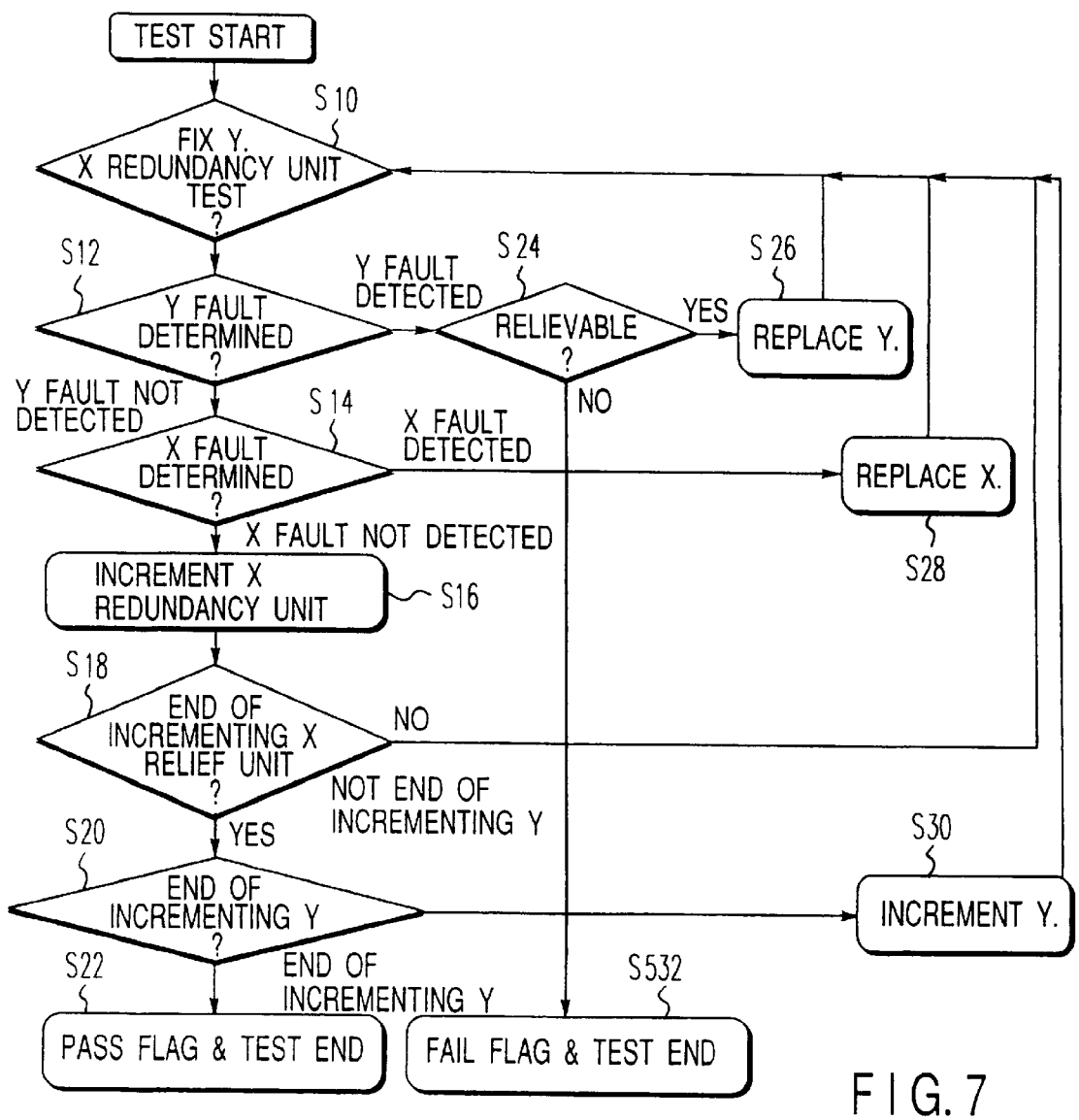
FIG. 7 is a flow chart illustrating the sequence of operation for testing a semiconductor memory device, or a DRAM, according to a third embodiment of the present invention.

FIG. 7 is a flow chart illustrating the sequence of operation for testing a semiconductor memory device, or a DRAM, according to a third embodiment of the present invention. The DRAM has a two-dimensional address space defined in terms of X and Y and essentially have a similar configuration to the DRAM described with reference to FIG. 4.

The test (Steps S10, S12, S14, S16, S18, S20, S22, S24, S26, S28, S30 and S32) is conducted by a scanning method firstly along the X-direction in the two-dimensional XY address space of the DRAM. Firstly, the Y address of the XY address space is held unchanged and only the X addresses are shifted on the basis of a unit of redundancy, for the test (Step S10). Faulty of the Y address is first determined (Step S12) and, if no faulty of the Y address is detected, faulty of X addresses of the unit of redundancy will then be determined (Step S14). If no faulty of the X addresses are detected, the X addresses is incremented on the basis of the unit of redundancy in the X-direction to proceed to testing of the next X addresses of the unit of redundancy (Step S16).

If the number of cells to be relieved exceeds the number of the X redundancy memory cells in the above test process (Step S18), Y redundancy memory cells will be used for relief (Steps S20 and S30). During this operation, the number of Y redundancy memory cells used for redundancy is counted and, when the count value exceeds the number of all the Y redundancy memory cells and hence it is no longer possible to proceed the replacement operation (no in Step S24), a fail flag (Step S32) is immediately enabled to stop the sequence (Test End).

If the number of Y redundancy memory cells is suffice for the replacement, the addresses of the faulty Y cells are written in the register to be used for storing information on relieving Y cells to replace the faulty cells by the Y redundancy memory cells (Step S26), and then the redundancy memory cells will be tested.

If the number of cells to be relieved do not exceed the number of the X redundancy memory cells, that is, the number of X redundancy memory cells is suffice for the replacement, the addresses of the faulty X cells are written in the register to be used for storing information on relieving X cells to replace the faulty X cells by X redundancy memory cells, and then the X redundancy memory cells will be tested.

The test proceeds in this way, using redundancy X or Y cells for replacements and, when no fail occurs, the unit of redundancy X cells is incremented to proceed to the next test to be conducted on the basis of the incremented unit of redundancy X cell.

The above operation is repeated until the test is performed for every unit of redundancy X cells, and then the Y address is incremented and the above test is repeated. When the test is performed for all the Y addresses, a pass flag is enabled to end the sequence (Test End).

Figure 8:
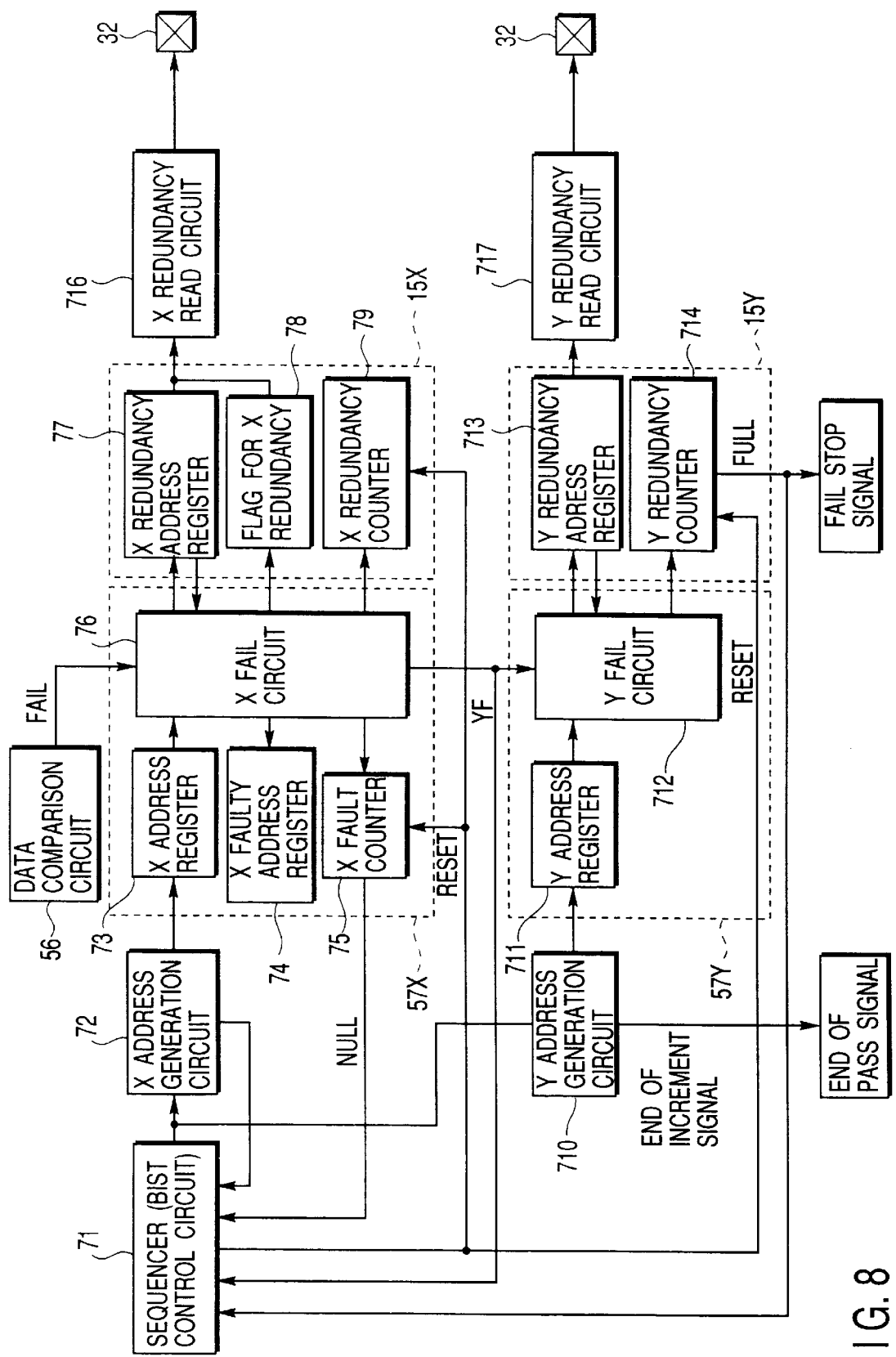
FIG. 8 is a block diagram of part of the memory circuit section and part of the BIST circuit designed to execute the sequence of FIG. 7.

FIG. 8 is a block diagram of part of the memory circuit section and the BIST circuit of the DRAM of FIG. 7 designed to execute the sequence of FIG. 7.

In the memory circuit section of FIG. 8, reference symbol 15X denotes a register section for X redundancy data and 15Y denotes a register section for Y redundancy data, while reference symbol 716 denotes an X redundancy data read circuit and reference symbol 717 denotes a Y redundancy data read circuit. Reference symbol 32 denotes an external terminal.

The register section 15Y for X redundancy data includes a redundancy address register 77, a flag register 78 for X redundancy data and an X redundancy counter 79.

The register section 15Y for Y redundancy data includes a redundancy address register 713 and a Y redundancy counter 714.

The BIST circuit comprises a sequencer (BIST control circuit) 71 for controlling the entire BIST circuit, an x address generation circuit 72, a data comparison circuit 56, an X address redundancy allocation determining circuit 57X, a Y address generation circuit 710 and a Y address redundancy allocation determining circuit 57Y. Note that the redundancy data rewriting circuit is not shown in FIG. 8. Also note that each semiconductor chip requires only a pair of redundancy allocation determining circuits 57X and 57Y.

The X address generation circuit 72 generates an X-directional address upon receiving a signal from the sequencer 71 and sends to the sequencer 71 an X redundancy unit end signal (not shown) when the operation of using the current X redundancy unit is over and an X redundancy unit increment end signal (not shown) when the operation of incrementing the X redundancy unit is over.

X address register 73 holds the X address generated by the X address generation circuit 72 until the data comparison circuit 56 performs an operation of comparing data. X faulty address register 74 stores the row address of the cells that is failed during the test. X fault counter 75 is reset at the start of the test and counts the number of fails (faults) in the test until the number of relievable cells is reached. A null signal Null indicating that the output of X fault counter 75 is equal to "0" is output to the sequencer 71.

In X fail circuit 76, the reading of the X fault counter 75 is incremented each time a fail signal is sent from the data comparison circuit 56. Furthermore, the X fail circuit 76 holds faulty X address value in the X faulty address register 74 by referring to the X address register 73. The Y address generation circuit 710 generates a Y-directional address upon receiving a signal from the sequencer and sends to the sequencer 71 a Y redundancy unit end signal (not shown) when the operation of using the current Y redundancy unit is over and a Y redundancy unit increment end signal (not shown) when the operation of incrementing the Y redundancy unit is over.

If the output signal of the X fault counter 75 is Null at the time when the sequencer 71 receives a signal representing the end of the test using an X redundancy unit from the X address generation circuit 72 after the completion of the test of using the current X redundancy unit, the sequencer 71 proceeds to the test using the next X redundancy unit as the next step of the test sequence. If, on the other hand, the output signal of the X fault counter 75 is not Null at that time, the sequencer 71 waits for an operation using a redundancy memory cell as replacement and a redundancy replacement end signal sent from the X fail circuit 76 or the Y fail circuit 712. Upon receiving the signal, the test using the same X redundancy unit is restarted.

Upon receiving an X redundancy unit test end signal from the X address generation circuit 72 after the completion of the X redundancy unit test, the X fail circuit 76 compares the count value in the X fault counter 75 and the remaining count (representing the number of the available X spares) of the X redundancy counter 79 in the register section 15X for X redundancy data.

If the remaining count of the X redundancy counter 79 is not smaller than the count value of the X fault counter 75, the value of the X faulty address register 74, or the count value of the X fault counter 75, is input to the X redundancy address register 77 in the register section 15X for X redundancy data as X replacements.

If the count value of the X fault counter exceeds the remaining count (representing the number of the available X spares) of the X redundancy counter 79, the X fail circuit 76 determines that the circuit is faulty for Y address and outputs a YF (Y fail) signal.

Upon receiving a YF signal, the Y fail circuit 712 acquires the Y address that is currently being tested from the Y address register 711 and writes the Y address in the Y redundancy address register 713 in the register section 15Y for Y redundancy data, thus increasing the count value of the Y redundancy counter 714.

If any of the Y redundancy counters 713 of the DRAM gets to the full count, it outs a full signal Full or a fail stop signal Fail Stop to ceases the operation of the sequencer 71. The signal Fail Stop is read by way of a pad subsequently.

When the test pattern comes to the end as a result of the relief operation, the Y address generation circuit 710 outputs an increment end signal (pass end signal), which is also read subsequently by way of a pad.

After the end of the test, the addresses held in the register section 15Y for Y redundancy data are read by means of the X redundancy data read circuit 716 and the Y redundancy data read circuit 717 and then programmed in the redundancy data, storage element typically by using a laser.

The X fail circuit 76 and the Y fail circuit 712 refer to the respective addresses in the X address generation circuit 72 and the Y address generation circuit 710 and determine the operating positions of the X redundancy address register 77 and the X redundancy counter 79, and the Y redundancy address register 713 and the Y redundancy counter 714, respectively.

As described above in detail, according to the invention, there is provided a semiconductor memory device comprising a BIST circuit for acquiring redundancy information that can be realized with a minimal increase of the pattern area and uses a simple algorithm to consequently reduce the faulty rate of the BIST circuit itself as well as a method of testing such a semiconductor memory device.

According to the present invention, there is also provided a semiconductor memory device in which data can be transferred to a following-stage circuit whenever necessary regardless of the data stored in a memory element that is not electrically rewritable so that the input to the following-stage circuit can be easily attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory circuit having an X, Y two-dimensional address space and comprising an array of regular memory cells and an array of X, Y redundancy memory cells;
   a storage element which stores redundancy data, including non-volatile elements to which the redundancy data is externally programmable and not electrically re-programmable;
   a register which holds the redundancy data of said storage element when the semiconductor memory device is activated;
   a redundancy determining circuit which compares the data held in said register and an externally input address to determine use or non-use of said redundancy memory cells; and
   a redundancy data rewriting circuit which rewrites the redundancy data held in said register to a different redundancy data.

2. The semiconductor memory device according to claim 1, wherein said redundancy data rewriting circuit is controlled by a signal from a test circuit mounted on a semiconductor chip of said semiconductor memory device or a signal of a test circuit provided outside the semiconductor chip.

3. The semiconductor memory device according to claim 2, wherein said test circuit is a built-in type test circuit for self-generating a test pattern.

4. The semiconductor memory device according to claim 3, wherein said built-in test circuit performs a sequence of:
   testing X addresses of the regular memory cells of a unit of redundancy to determine whether the X addresses of the regular memory cells are faulty or not, while fixing the Y addresses;
   replacing the regular memory cells of the X addresses with the X redundancy memory cells when the X addresses of the regular memory cells are determined faulty and relieved by using the X redundancy cells alone, while replacing the regular memory cells of the X addresses with the Y redundancy memory cells when the X addresses of the regular memory cells are determined faulty and not relieved by using the X redundancy cells alone;
   re-testing the X addresses of the regular memory cells and the replaced redundancy memory cells to determine whether the X addresses of the regular memory cells and the replaced redundancy memory cells are faulty or not;
   repeating said replacing and said re-testing, while changing the X or Y redundancy memory cells, until it is determined that the X ox Y addresses are not faulty;
   repeating said testing, said replacing, said re-testing and said repeating for next and succeeding X addresses of the regular memory cells, while changing the X addresses of the regular memory cells on the basis of the unit of redundancy, up to final X addresses of the regular memory cells of the unit of redundancy;
   repeating said testing, said replacing, said re-testing and said repeatings, while changing the Y address, up to final X addresses of the regular memory cells of the address space; and
   outputting a pass signal when said testing, said replacing, said re-testing and said repeatings are repeated up to final X addresses of the regular memory cells, while outputting a fail signal to end said testing if all the redundancy cells are replaced before outputting the pass signal.

5. The semiconductor memory device according to claim 3, wherein said built-in type test circuit comprises:
   a data generation circuit for generating a pattern of data to be written to said memory circuit;
   an address generation circuit for generating an address pattern to specify an address of said memory circuit;
   an expected value generation circuit for generating an expected value data relative to an output data of said memory circuit;
   a data comparison circuit for comparing said output data and said expected value data; and
   a redundancy allocation circuit for determining an allocation of said redundancy memory cells in response to an output of said data generation circuit and an output of said address generation circuit, said redundancy data rewriting circuit being controlled by an output of the redundancy allocation circuit.

6. The semiconductor memory device according to claim 5, wherein said built-in test circuit performs a sequence of:

testing addresses of the regular memory cells of a unit of redundancy to determine whether the addresses of the regular memory cells are faulty or not;

replacing the regular memory cells of the addresses with the redundancy memory cells to relieve the faulty addresses of the regular memory cells;

inputting redundant information to said register by means of said redundancy data rewriting circuit;

re-testing the addresses of the regular memory cells and the replaced redundancy memory cells to determine whether the addresses of the regular memory cells and the replaced redundancy memory cells are faulty or not;

repeating said replacing, said inputting and said re-testing, until it is determined that the addresses are not faulty;

repeating said testing, said replacing, said inputting, said re-testing and said repeating for next and succeeding addresses of the regular memory cells, up to final addresses of the regular memory cells of the unit of redundancy; and outputting a pass signal when said testing, said replacing, said inputting, said re-testing and said repeatings are repeated up to final addresses of the regular memory cells, while outputting a fail signal to end said testing if all the redundancy cells are replaced before outputting the pass signal.

7. The semiconductor memory device according to claim 1, further comprising a redundancy data read circuit which reads data held in said register to outside.

8. The semiconductor memory device according to claim 7, wherein said redundancy data rewriting circuit is controlled by a signal from a test circuit mounted on a semiconductor chip of said semiconductor memory device or a signal of a test circuit provided outside the semiconductor chip.

9. The semiconductor memory device according to claim 8, wherein said test circuit is a built-in type test circuit for self-generating a test pattern.

10. The semiconductor memory device according to claim 9, wherein said built-in test circuit performs a sequence of:

testing X addresses of the regular memory cells of a unit of redundancy to determine whether the X addresses of the regular memory cells are faulty or not, while fixing the Y addresses;

replacing the regular memory cells of the X addresses with the X redundancy memory cells when the X addresses of the regular memory cells are determined faulty and relieved by using the X redundancy cells alone, while replacing the regular memory cells of the X addresses with the Y redundancy memory cells when the X addresses of the regular memory cells are determined faulty and not relieved by using the X redundancy cells alone;

re-testing the X addresses of the regular memory cells and the replaced redundancy memory cells to determine whether the X addresses of the regular memory cells and the replaced redundancy memory cells are faulty or not;

repeating said replacing and said re-testing, while changing the X or Y redundancy memory cells, until it is determined that the X or Y addresses are not faulty;

repeating said testing, said replacing, said re-testing and said repeating for next and succeeding X addresses of the regular memory calls, while changing the X addresses of the regular memory cells on the basis of the unit of redundancy, up to final X addresses of the regular memory cells of the unit of redundancy;

repeating said testing, said replacing, said re-testing and said repeatings, while changing the Y address, up to final X addresses of the regular memory cells of the address space; and outputting a pass signal when said testing, said replacing, said re-testing and said repeatings are repeated up to final X addresses of the regular memory cells, while outputting a fail signal to end said testing if all the redundancy cells are replaced before outputting the pass signal.

11. The semiconductor memory device according to claim 9, wherein said built-in type test circuit comprises:

a data generation circuit for generating a pattern of data to be written to said memory circuit;

an address generation circuit for generating an address pattern to specify an address of said memory circuit;

an expected value generation circuit for generating an expected value data relative to an output data of said memory circuit;

a data comparison circuit for comparing said output data and said expected value data; and a redundancy allocation circuit for determining an allocation of said redundancy memory cells in response to an output of said data generation circuit and an output of said address generation circuit, said redundancy data rewriting circuit being controlled by an output of the redundancy allocation circuit.

12. The semiconductor memory device according to claim 11, wherein said built-in test circuit performs a sequence of:

testing addresses of the regular memory cells of a unit of redundancy to determine whether the addresses of the regular memory cells are faulty or not;

replacing the regular memory cells of the addresses with the redundancy memory cells to relieve the faulty addresses of the regular memory cells;

inputting redundant information to said register by means of said redundancy data rewriting circuit;

re-testing the addresses of the regular memory cells and the replaced redundancy memory cells to determine whether the addresses of the regular memory cells and the replaced redundancy memory cells are faulty or not;

repeating said replacing, said inputting and said re-testing, until it is determined that the addresses are not faulty;

repeating said testing, said replacing, said inputting, said re-testing and said repeating for next and succeeding addresses of the regular memory cells, up to final addresses of the regular memory cells of the unit of redundancy; and outputting a pass signal when said testing, said replacing, said inputting, said re-testing and said repeatings are repeated up to final addresses of the regular memory cells, while outputting a fail signal to end said testing if all the redundancy cells are replaced before outputting the pass signal.

13. A semiconductor memory device comprising:

a storage element to which data is programmable and not electrically re-programmable;

a transfer circuit which transfers the data programmed to said storage element to a following-stage circuit;

a changing circuit in said transfer circuit, which selectively changes the data to be transferred.

14. The semiconductor memory device according to claim 13, wherein said transfer circuit further comprises a data holding circuit which holds the data programmed to said storage element; and said changing circuit changes the data held in said data holding circuit to a different data.

15. The semiconductor memory device according to claim 13, wherein said changing circuit inactivates the transfer of the data programmed to said storage element and changes the data to a different data.

16. A method of testing a semiconductor memory device comprising an array of regular memory cells and an array of redundancy memory cells to be used for relief by means of a built-in type test circuit, said testing method performing a sequence of:

testing addresses of the regular memory cells of a unit of redundancy to determine whether the addresses of the regular memory cells are faulty or not;

replacing the regular memory cells of the addresses with the redundancy memory cells to relieve the faulty addresses of the regular memory cells;

inputting redundant information to said register;

re-testing the addresses of the regular memory cells and the replaced redundancy memory cells to determine whether the addresses of the regular memory cells and the replaced redundancy memory cells are faulty or not;

repeating said replacing, said inputting and said re-testing, until it is determined that the addresses are not faulty;

repeating said testing, said replacing, said inputting, said re-testing and said repeating for next and succeeding addresses of the regular memory cells, up to final addresses of the regular memory cells of the unit of redundancy; and outputting a pass signal when said testing, said replacing, said inputting, said re-testing and said repeatings are repeated up to final addresses of the regular memory cells, while outputting a fail signal to end said testing if all the redundancy cells are replaced before outputting the pass signal.

17. A method of testing a semiconductor memory device comprising an X, Y two-dimensional address space and an array of regular memory cells and an array of X, Y redundancy memory cells by means of a built-in type test circuit, wherein said testing method performs a sequence of:

testing X addresses of the regular memory cells of a unit of redundancy to determine whether the X addresses of the regular memory cells are faulty or not, while fixing the Y addresses;

replacing the regular memory cells of the X addresses with the X redundancy memory cells when the X addresses of the regular memory cells are determined faulty and relieved by using the X redundancy cells alone, while replacing the regular memory cells of the X addresses with the Y redundancy memory cells when the X addresses of the regular memory cells are determined faulty and not relieved by using the X redundancy cells alone;

re-testing the X addresses of the regular memory cells and the replaced redundancy memory cells to determine whether the X addresses of the regular memory cells and the replaced redundancy memory cells are faulty or not;

repeating said replacing and said re-testing, while changing the X or Y redundancy memory cells, until it is determined that the X or Y addresses are not faulty;

repeating said testing, said replacing, said re-testing and said repeating for next and succeeding X addresses of the regular memory cells, while changing the X addresses of the regular memory cells on the basis of the unit of redundancy, up to final X addresses of the regular memory cells of the unit of redundancy;

repeating said testing, said replacing, said re-testing and said repeatings, while changing the Y address, up to final X addresses of the regular memory cells of the address space; and outputting a pass signal when said testing, said replacing, said re-testing and said repeatings are repeated up to final X addresses of the regular memory cells, while outputting a fail signal to end said testing if all the redundancy cells are replaced before outputting the pass signal.

* * * * *